United States Patent
Ono

(10) Patent No.: US 6,432,776 B1
(45) Date of Patent: Aug. 13, 2002

(54) METHOD OF MANUFACTURING SEMICONDUCTOR DEVICE

(75) Inventor: Atsuki Ono, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/643,771

(22) Filed: Aug. 22, 2000

(30) Foreign Application Priority Data

Aug. 23, 1999 (JP) ............................................ 11-235003

(51) Int. Cl.[7] .................. H01L 21/8234; H01L 21/336
(52) U.S. Cl. .................. 438/275; 438/239; 438/257; 438/251; 438/279; 438/351; 438/238
(58) Field of Search ............................. 438/275, 199, 438/299, 303, 305, 673, 713, 585, 595, 258, 655, 238, 257, 210, 270, 271, 589, 239, 351, 279, 231, 241

(56) References Cited

U.S. PATENT DOCUMENTS

| | | | | |
|---|---|---|---|---|
| 6,037,222 A | * | 3/2000 | Huang et al. | 438/257 |
| 6,048,769 A | * | 4/2000 | Chau | 438/275 |
| 6,087,225 A | * | 7/2000 | Bronner et al. | 438/275 |
| 6,110,782 A | * | 8/2000 | Chu et al. | 438/275 |
| 6,184,083 B1 | * | 2/2001 | Tsunashima et al. | 438/257 |
| 6,242,300 B1 | * | 6/2001 | Wang | 438/239 |

FOREIGN PATENT DOCUMENTS

| | | |
|---|---|---|
| JP | 58-61645 | 4/1983 |
| JP | 58-124268 | 7/1983 |
| JP | 63-42173 | 2/1988 |
| JP | 3-79078 | 4/1991 |
| JP | 4-162771 | 6/1992 |
| JP | 9-148449 | 6/1997 |
| JP | 10-163337 | 6/1998 |

OTHER PUBLICATIONS

Japanese Office Action dated Dec. 27, 2001 and partial English translation.

* cited by examiner

Primary Examiner—Caridad Everhart
Assistant Examiner—Igwe U.. Anya
(74) Attorney, Agent, or Firm—McGinn & Gibb, PLLC

(57) ABSTRACT

A section separator region is formed in a semiconductor substrate in which a p-type well region has been formed, to separate the substrate into an I/O section and a core section. An oxide film and a plysilicon film are form at the I/O section, and pre-formation treatment is carried out. Then, an oxide film is formed over the exposed surface by the thermal oxidization. A metal film is formed on the oxide film. The metal film on the I/O section is moved. The polysilicon film and the metal film are patterned to be gate electrodes. Then, ion implantation is carried out to implant impurity into the exposed surface to form source/drain regions corresponding to the gate electrodes respectively.

18 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, more particularly to a method of forming a plurality of MOS transistors on a substrate wherein different source voltages are supplied to the MOS transistors respectively.

2. Description of the Related Art

A semiconductor integrated circuit device in which transistors whose gate electrodes are made of polysilicon and transistors whose gate electrodes are made of metal are formed on a semiconductor substrate has been in a practical use instead of the conventional semiconductor device using only transistors whose gate electrodes are made of polysilicon, because the polysilicon shows high resistivity which is load for fast operation.

Since an I/O section of such the semiconductor device requires stable drive, it has relatively long gate length, a thick gate insulation film, and is driven by a relatively high voltage. A gate electrode of the I/O section is made of polysilicon.

Another section of the above described semiconductor device is a core section which performs substantial operation of the circuit, such as calculation. Since the core section requires fast operation, it has a metal gate electrode, and is driven by a relatively low voltage. Fine design rule is applied to the core section, that is, the thickness of a gate insulation film is thinner than that of the I/O section.

Unexamined Japanese Patent Application KOKAI Publication No. H4-162771 discloses a semiconductor integrated circuit device whose structure is similar to the above. According to the application, a gate insulation film (for I/O section) having a first thickness is formed by thermal oxidization, and another gate insulation film (for core section) is formed by thermal oxidization. The second oxidization for forming the gate insulation film of the core section further oxidizes the gate insulation film of the I/O section, thus, it becomes thicker. Accordingly, it is difficult to form desired gate insulation film of the I/O section.

Unexamined Japanese Patent Application KOKAI Publication No. S58-124268 discloses an integrated circuit device in which a transistor having a polysilicon gate electrode and a transistor having a metal gate electrode are formed on a semiconductor substrate. According to the disclosed technique, a gate insulation film beneath the polysilicon gate electrode and another gate insulation film beneath the metal gate electrode are formed simultaneously, therefore, they have the same thickness.

Unexamined Japanese Patent Application KOKAI Publication No. S58-61645 discloses a master slice integrated circuit device. The disclosed technique realizes an integrated circuit device having less occupied area with well-regulated arrangement by sharing a source/drain region of a drive MOS transistor and a source/drain region of a load MOS transistor. However, the application does not have any description regarding to gate insulation films for the transistors.

SUMMARY OF THE INVENTION

The present invention has been made in consideration of the above, it is an object of the present invention to provide a method of manufacturing a reliable semiconductor device in which a plurality of transistors whose gate electrode insulation films have different thickness.

To achieve the above object, a method according to the present invention is a method of manufacturing a semiconductor device comprises:

forming a section separator region in a semiconductor substrate to separate the semiconductor substrate into a first region and a second region;

forming a first insulation film at the first region on the semiconductor substrate forming a first gate electrode material layer on the first insulation film;

forming a second insulation film whose thickness differs from the thickness of the first insulation film over the exposed surface after the first gate electrode material layer is formed;

forming a second gate electrode material layer on the second gate insulation film removing the second gate electrode material layer at the first region after the second gate electrode material layer is formed;

forming a first gate electrode with the first gate electrode material layer at the first region after the second gate electrode material layer is removed, while forming a second gate electrode with the second gate electrode material layer at the second region;

removing second insulation film remaining on the first gate electrode after the first and second gate electrodes are formed;

forming first source/drain regions at the first region, and forming second source/drain regions at the second region, after the second insulation film is removed; and etching the first and second insulation films with masking by the first and second gate electrodes to form a first and second gate insulation films, after the first and second source/drain regions are formed.

The method may further comprises:

forming a protection film on the first gate electrode material layer;

forming a second insulation film at the second region after the protection film is formed; and forming a second gate electrode material layer over an exposed surface including surfaces of the protection film and the second insulation film, after the second insulation film is formed.

The removing steps may include polishing the second gate electrode material layer on the protection film which acts as a stopper.

The protection film may be made of silicon nitride.

In this case, the first and second source/drain regions may have predetermined concentration;

side walls of the first and second gate electrodes may be formed after the source/drain regions are formed;

third and fourth source/drain regions whose concentration differs from the predetermined concentration of the first and second source/drain regions may be formed so as to connect to the first and second source/drain regions respectively, after the side walls are formed; and the forming gate insulation film may include etching the first and second gate insulation films with masking by the first and second gate electrodes and the side walls.

The second gate electrode material layer may include a refractory metal or refractory silicide.

In this case, the method may further comprise forming a barrier metal between the second gate electrode material layer including the refractory metal or refractory silicide and the second gate electrode insulation film.

According to the above method, the pre-formation treatment is carried out while the first gate electrode material layer to be a first gate electrode has been formed on the first oxide film at the first region. Therefore, the first oxide film is not damaged by the preformation treatment. Further, the first gate electrode material layer acts as a protection film while forming the second oxide film for the second region by the thermal oxidization. Therefore, no additional oxide film is formed on the first oxide film.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Embodiments of the present invention will now be described.

First Embodiment

A method according to a first embodiment for manufacturing a semiconductor device will now be described with reference to FIGS. 1 to 11. In the first embodiment, a method of manufacturing an n-type single transistor will be explained, however, the method may be applicable to manufacturing a p-type transistor, a CMOS transistor, and the like.

Figure 1:
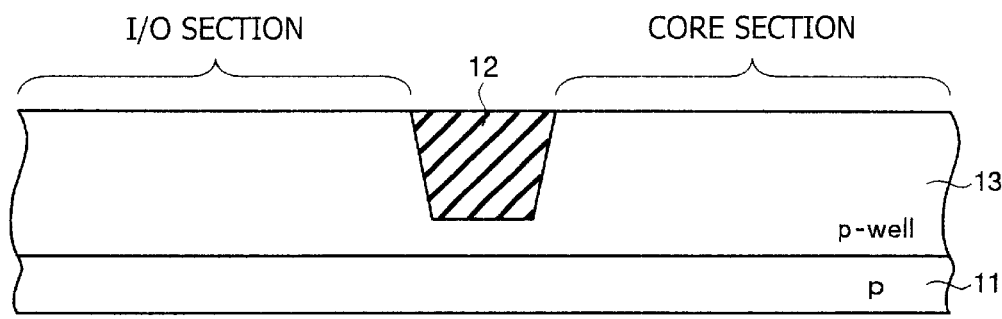
FIGS. 1 to 11 are cross sectional views showing a semiconductor device for explaining its manufacturing process according to a first embodiment of the present invention.

The trench isolation technique is carried out to form a section separator region 12 made of silicon oxide is formed on a semiconductor substrate 11 as shown in FIG. 1. Then, ion implantation is carried out to form p-type well region 13 therein. In this case, the dopant is boron, the dosage is 1E13 ions/cm$^2$, and the implant energy is 150 keV. The semiconductor substrate has an epitaxial layer whose resistivity is approximately 10 $\mu$/cm.

Then, ion implantation is carried out onto a core section in order to adjust threshold of the core section. In this case, the dopant is boron, the dosage is 8E12 ions/cm$^2$, and the implant energy is 30 keV. For threshold adjustment at an I/O section, another ion implantation is further carried out onto the I/O section. In this case, the dopant is boron, the dosage is 6E12 ions/cm$^2$, and the implant energy is 30 keV.

Figure 2:
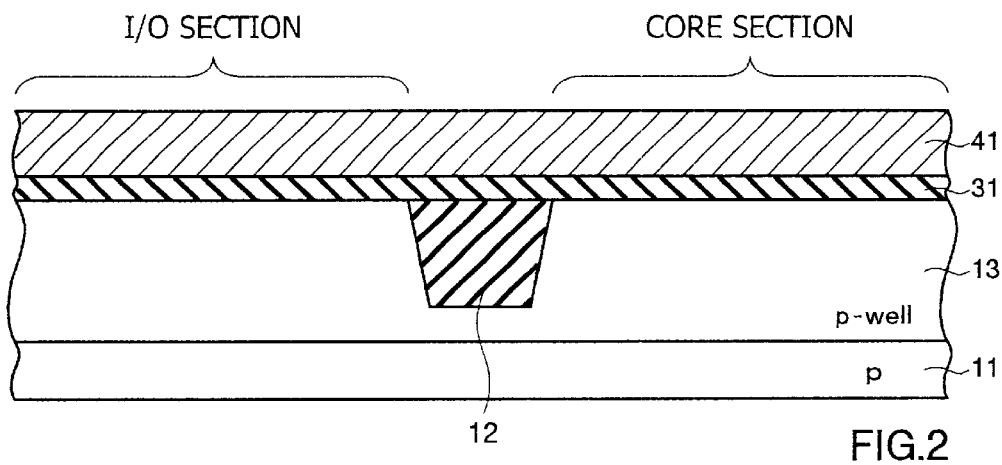

Then, an oxide film 31 to be a gate insulation film of the I/O section if formed on the surface of the semiconductor substrate 11 as shown in FIG. 2 by thermal oxidization. The oxide film 31 should have enough thickness which prevents breakdown from occurring when a drive voltage (for example, 3.3V) for the I/O section is applied thereto.

In this embodiment, the oxide film 31 has the thickness of 7 nm.

Then, the LPCVD (Low Pressure Chemical Vapor Deposition) is carried out to form a polysilicon film 41 having the thickness of 400 nm is formed on the oxide film 31.

Figure 3:
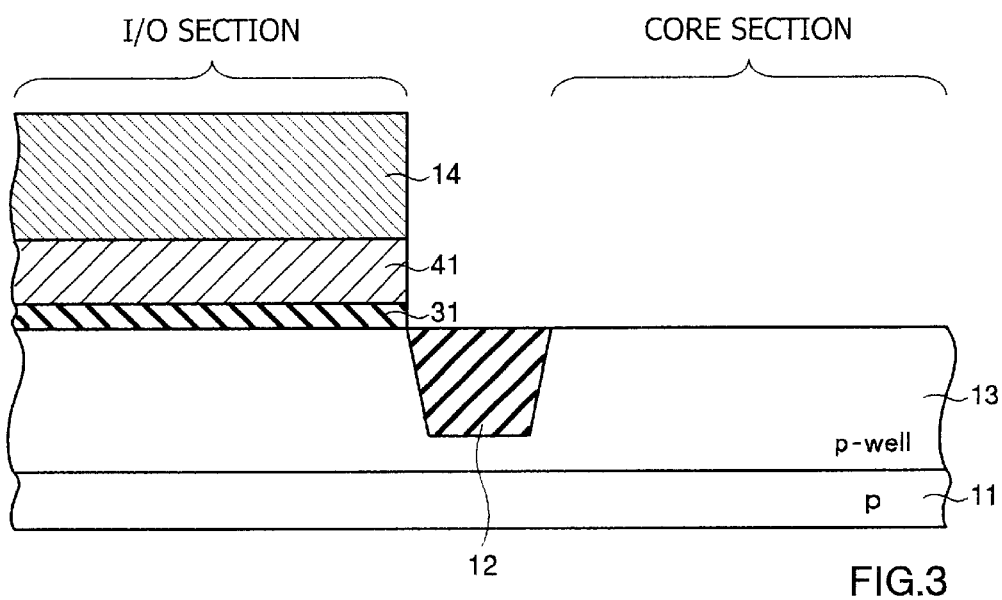
Figure 4:
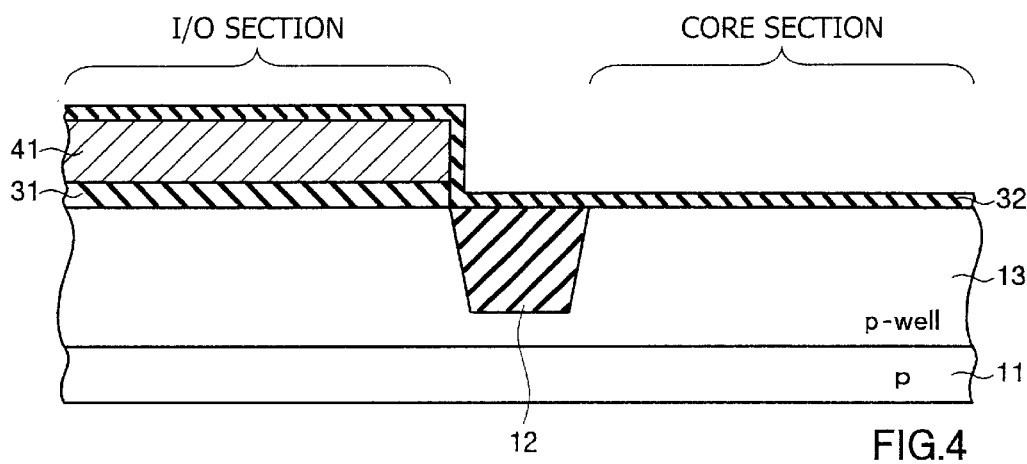

A photoresist film 14 is formed on the I/O section as shown in FIG. 3 before RIE (Reactive Ion Etching) is carried out, thus, the polysilicon film 41 on any areas other than the I/O section is removed away. The wet etching using buffered hydrofluoric acid follows, thus, the oxide film 31 on any areas other than the I/O section is removed away.

Then the surface of the semiconductor substrate 11 is washed with hydrofluoric acid or the like after the photoresist film 14 is removed away (pre-formation treatment). Since the polysilicon film 41 has been formed on the oxide film 31 at the I/O section, the oxide film 31 at the I/O section is not damaged by the washing.

After the washing, thermal oxidization is carried out again to form an oxide film 32 having the thickness of 2 nm over the exposed surface. Since the polysilicon film 41 has been formed on the oxide film 31 at the I/O section, additional oxide film is not formed on the oxide film 31 at the I/O section by the thermal oxidization. Therefore, the oxide film 31 formed by the thermal oxidization has desired thickness.

Figure 5:
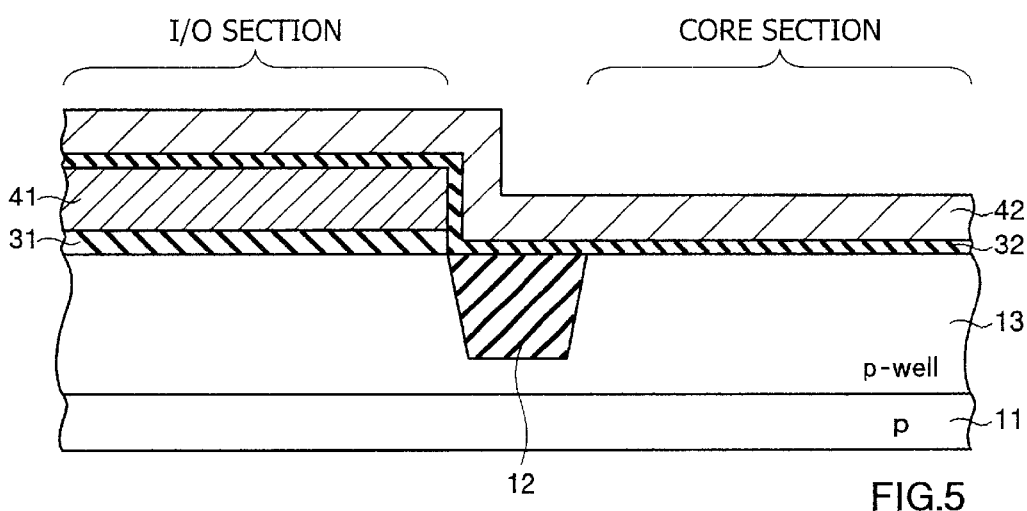

To form a barrier metal layer, the reactive sputtering is carried out to deposit titanium nitride onto the exposed surface until the deposited titanium nitride has the thickness of 30 nm. The CVD is further carried out to deposit tungsten (refractory metal) on to the titanium nitride until the deposited tungsten has the thickness of 300 nm, thus, a refractory metal film 42 is formed as shown in FIG. 5.

Figure 6:
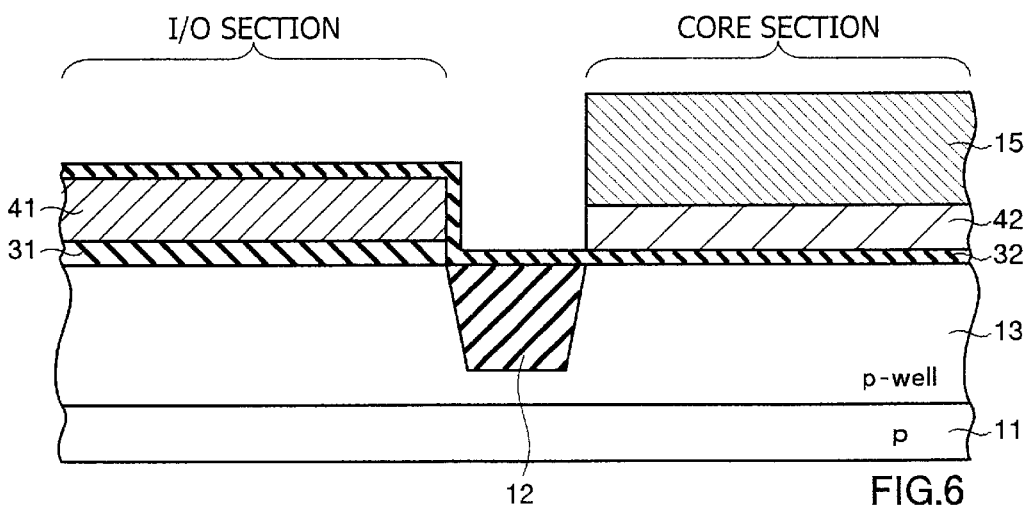

After the refractory metal film 42 is formed, a photoresist film 15 is formed on the core section as shown in FIG. 6. Then, etching is carried out to remove the refractory metal film 42 on any areas other than the core section.

Figure 7:
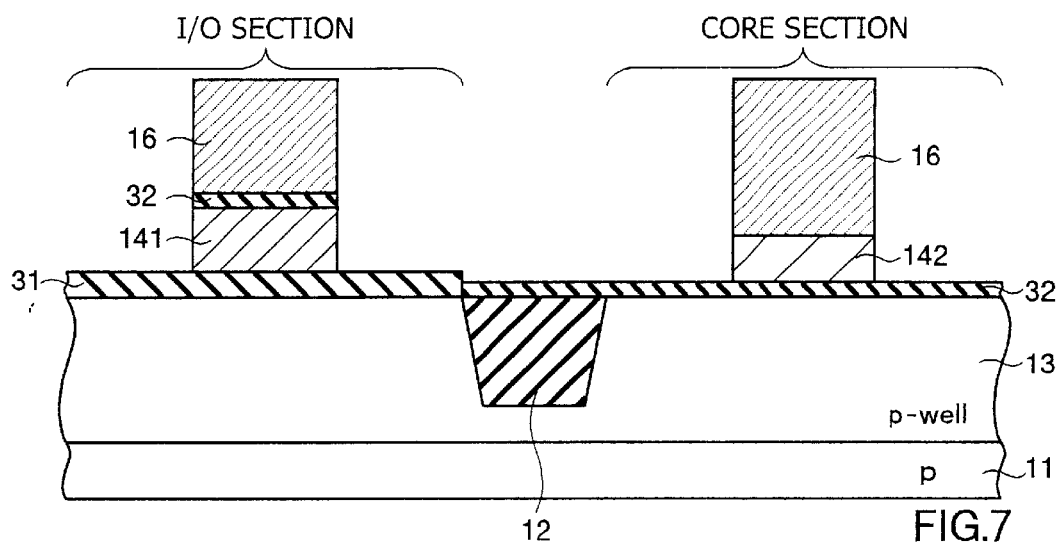

After removing the photoresist film 15, another photoresist film 16 is formed at desired positions corresponding to gate electrodes to be formed on the I/O section and the core section as shown in FIG. 7. Then, etching is carried out, to remain the oxide film 32 and the polysilicon film 41 under the photoresist film 16 at the I/O section, and the refractory metal film 42 under the photoresist film 16 at the core section. Thus, a gate electrode 141 (remaining polysilicon film 41) for the I/O section, and another gate electrode 142 (remaining refractory metal film 42) for the core section are formed. In this case, the gate length of the gate electrode 141 is 0.35 micrometers, while the that of the gate electrode 142 is 0.1 micrometer.

Figure 8:
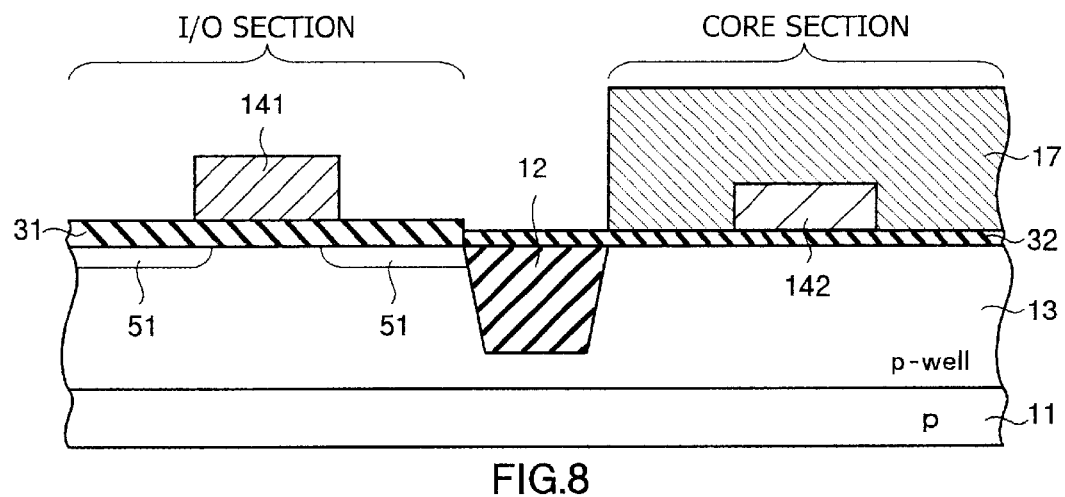

After removing the photo resist film 16 and the oxide film 32 on the gate electrode 141, a photoresist film 17 is formed on the core section as shown in FIG. 8. The ion implantation is carried out onto the I/O section with masking by the photoresist film 17 and the gate electrode 141. In this case, the dopant is phosphorus, the dosage is 6E13 ions/cm$^2$, and the implant energy is 45 keV. After the ion implantation, LDD (Lightly Doped Drain) regions 51 are formed by thermal diffusion.

Figure 9:
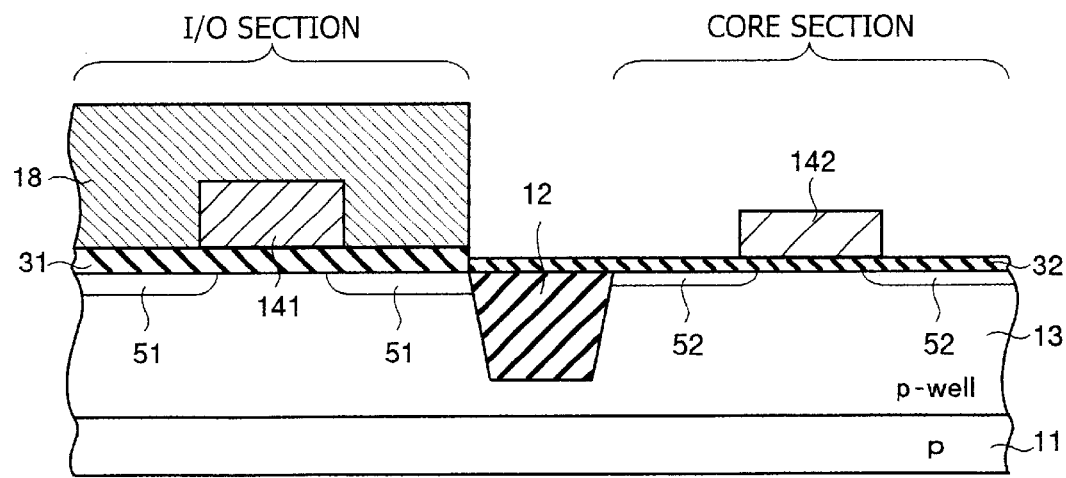

Then, the photoresist film 17 is removed and another photoresist film 18 is formed on the I/O section as shown in FIG. 9. The ion implantation is carried out onto the core section with masking by the photoresist film 18 and the gate electrode 142. In this case, the dopant is arsenic, the dosage is 5E14 ions/cm$^2$, and the implant energy is 3 keV. After the ion implantation, extended source/drain regions 52 are formed by thermal diffusion.

Figure 10:
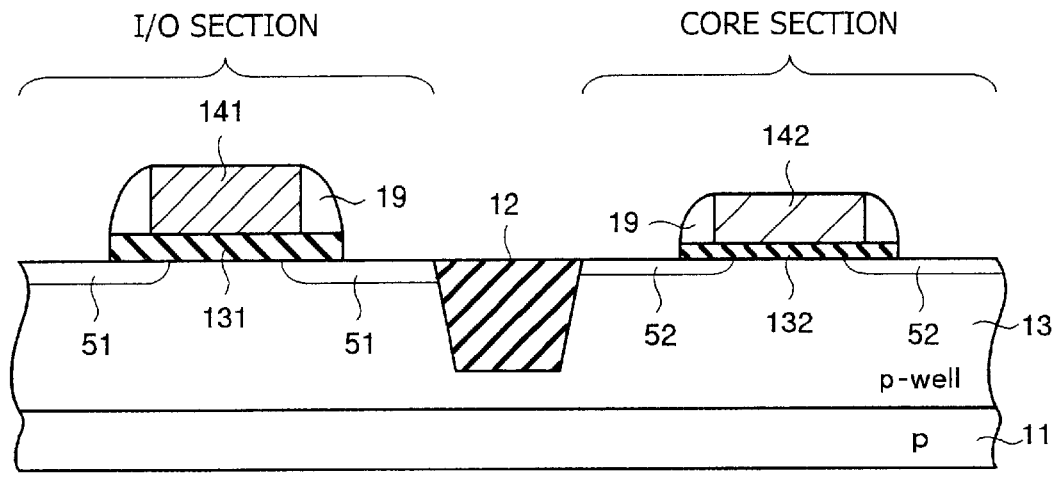

After the photoresist film 18 is removed, a silicon oxide film 19 is formed all over the exposed surface. Then, etching is carried out to etch the silicon oxide film 19 and the oxide films 31 and 32, so that side walls 19 of the gate electrodes 141 and 142, the oxide film just beneath the gate electrode 141, and the oxide film 32 just beneath the gate electrode 142 remain, as shown in FIG. 10. Thus, a gate insulation film 131 (remaining oxide film 31) for the I/O section, and another gate insulation film 132 (remaining oxide film 32) for the core section are formed.

Figure 11:
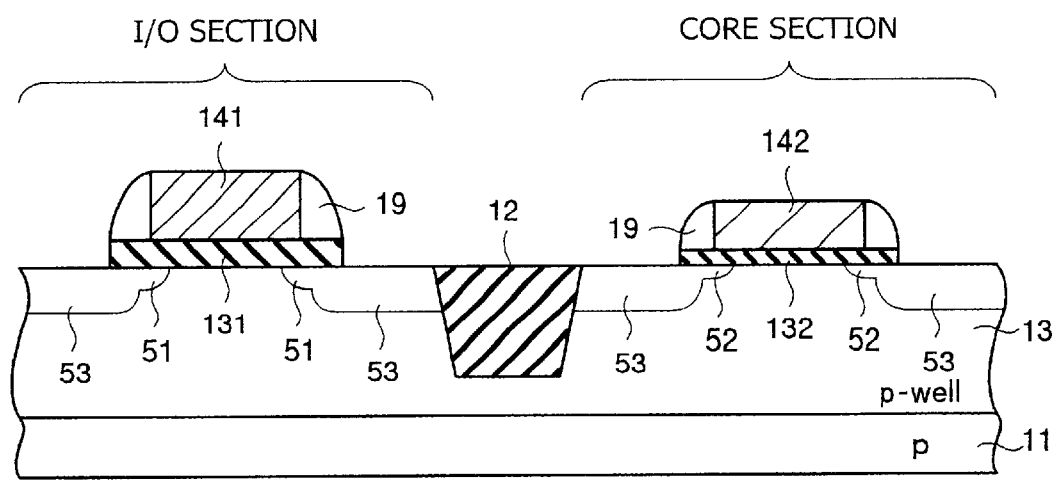

Then, the ion implantation is carried out onto all over the exposed surface with masking by the gate electrodes 141 and 142, and side walls 19. In this case, the dopant is arsenic, the dosage is 1E15 ions/cm$^2$, and the implant energy is 20 keV. After the ion implantation, source/drain regions 53 for the I/O section, and source/drain regions 54 for the core section are formed as shown in FIG. 11 by the thermal diffusion.

According to the method describe above, the pre-formation treatment is carried out while the polysilicon film 41 to be a gate electrode has been formed on the oxide film 31 at the I/O section. Therefore, the oxide film 31 is not damaged by the pre-formation treatment. Further, the polysilicon film 41 acts as a protection film while forming the oxide film 32 for the core section by the thermal oxidation. Therefore, no additional oxide film is formed on the oxide film 31.

Those features are helpful to form a desired gate insulation film at the I/O section. As a result, highly reliable semiconductor device is available by the method of the present invention.

Figure 12:
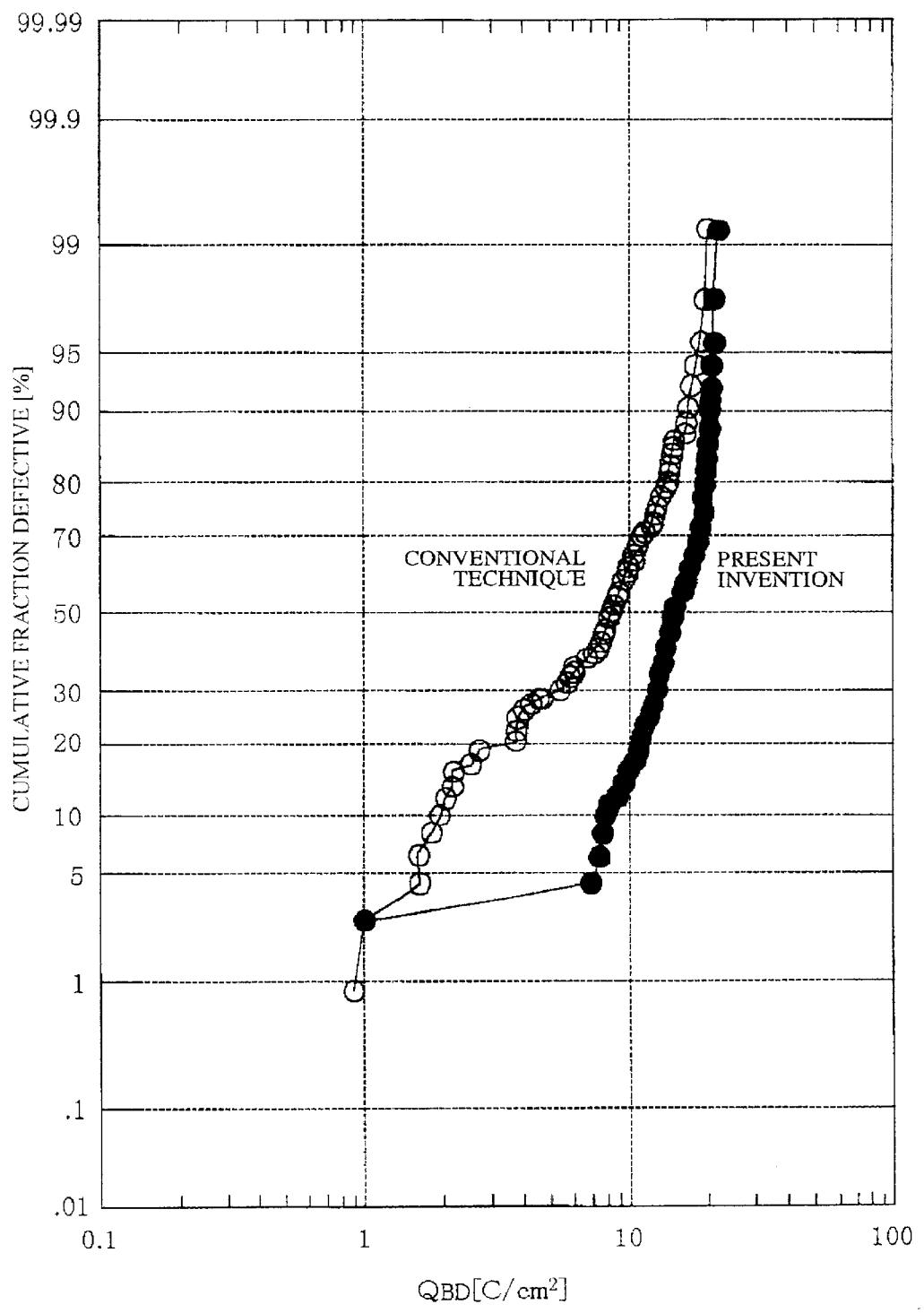
FIG. 12 is a graph showing QBD vs. cumulative fraction defective characteristics of gate oxide films of the first embodiment of the present invention and the conventional technique.

FIG. 12 is a graph showing QBD vs. cumulative fraction defective characteristics of gate oxide films for I/O section manufactured by the method of this embodiment and a conventional technique for comparing them. QBD represents the amount of charges injected until dielectric breakdown of the oxide film occurs. Reliability of the oxide film is proportional to QBD increase. The larger the characteristic curb inclines, the more stable performance the oxide film shows. As shown in FIG. 12, the gate oxide film for the I/O section according to this embodiment shows higher QBD and largely inclined characteristic curb rather than the conventional technique. That is, the gate oxide film according to this embodiment has excellent reliability and stable performance.

Second Embodiment

A method of manufacturing a semiconductor device according to a second embodiment will now be described with reference to FIGS. 13 to 21. In the following second embodiment, a method for manufacturing a single n-type transistor will be described, however, the method may be applicable to manufacture a p-type transistor, a CMOS transistor, and the like. The same reference symbols are applied to the same components over first and second embodiments.

Figure 13:
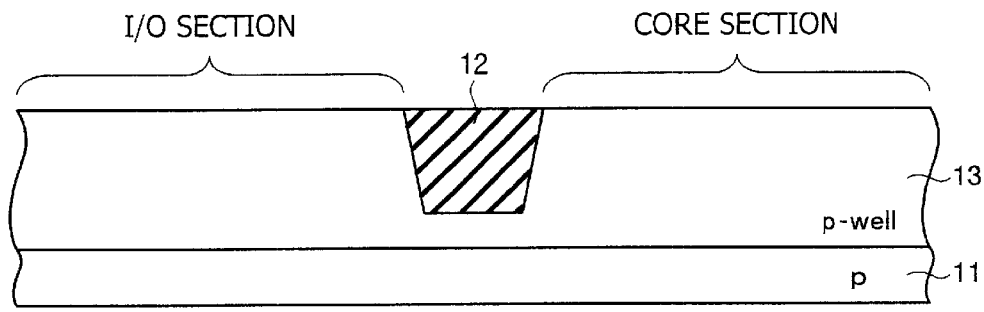
FIGS. 13 to 20 are cross sectional views showing a semiconductor device for explaining its manufacturing process according to a second embodiment of the present invention.

The trench isolation technique is carried out to form a section separator region 12 made of silicon oxide in a semiconductor substrate 11 as shown in FIG. 13. Then, boron is implanted into the semiconductor substrate 11 by the ion implantation to form a p-type well region 13.

Figure 14:
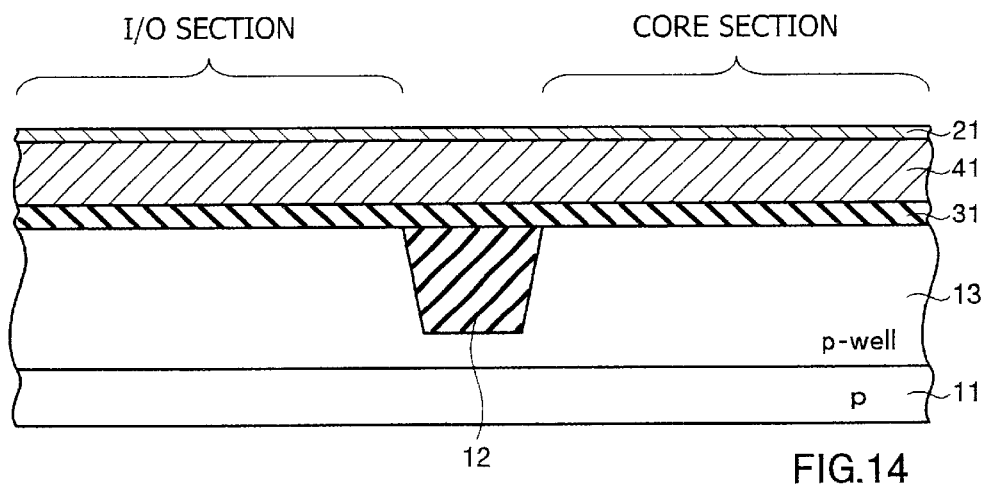

An oxide film 31 having the thickness of 7 nm is formed on the surface of the semiconductor substrate 11 as shown in FIG. 14 by the thermal oxidation. The LPCVD is further carried out to form a polysilicon film 41 having the thickness of 400 nm on the oxide film 31, and a silicon nitride film 21 having the thickness of 40 nm on the polysilicon film 41.

Figure 15:
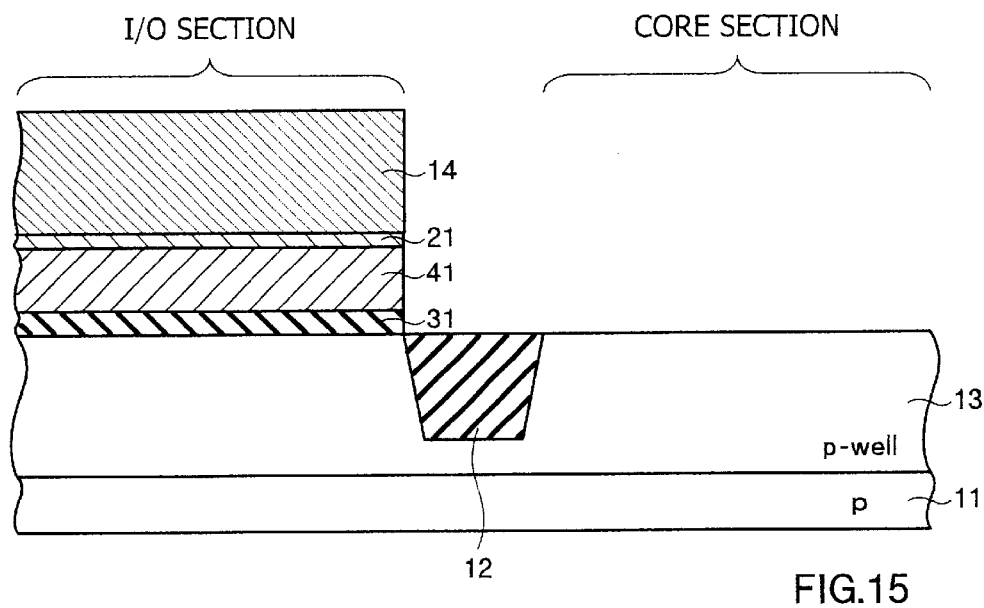
Figure 16:
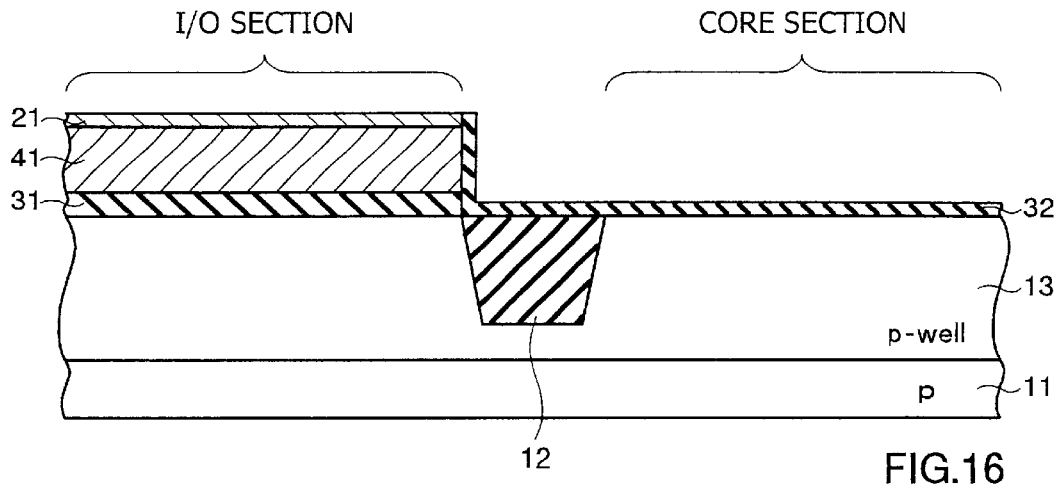

Then, a photoresist film 14 is formed on the I/O section. After the photoresist film 14 is formed, the silicon nitride film 21 at any areas other than the I/O section is removed by the dry etching, and the wet etching is further carried out to remove the polysilicon film 41 at any areas other than the I/O section, as shown in FIG. 15.

After the photoresist film 14 is removed, all exposed surface is washed with hydrofluoric acid or the like (pre-formation treatment). Since the polysilicon film 41 and the silicon nitride film 21 have been formed on the oxide film 31 on the YO section, the oxide film 31 on the I/O section is not damaged by the washing.

After the washing, the thermal oxidation is carried out again to form an oxide film 32 having the thickness of 2 nm, so as to cover the section separator region 12, the exposed p-type well region 13, and edge walls of the oxide film 31, the polysilicon film 41, and the silicon nitride film 21 at the I/O section. Since the polysilicon film 41 and the silicon nitride film 21 have been formed on the oxide film 31 at the I/O section, no additional oxide film is formed on the oxide film 31 by the thermal oxidation.

Figure 17:
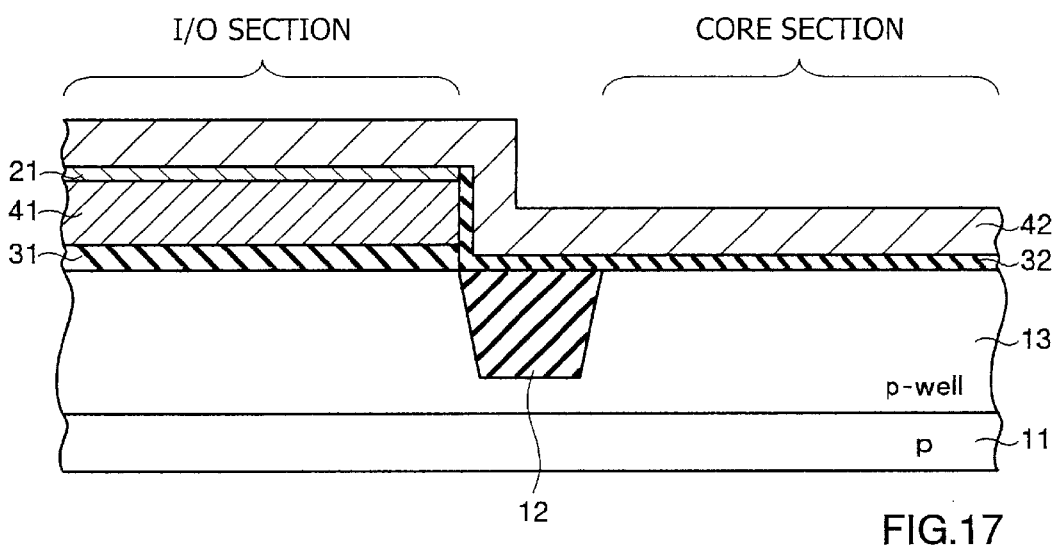

To form a barrier metal layer, the sputtering is carried out to deposit titanium-tungsten onto all over the exposed surface until the deposited titanium-tungsten has the thickness of 300 nm. Further, molybdenum (refractory metal) is deposited onto the titanium-tungsten by the sputtering until the deposited molybdenum has the thickness of 300 nm. Thus, a refractory metal film 42 is formed as shown in FIG. 17.

Figure 18:
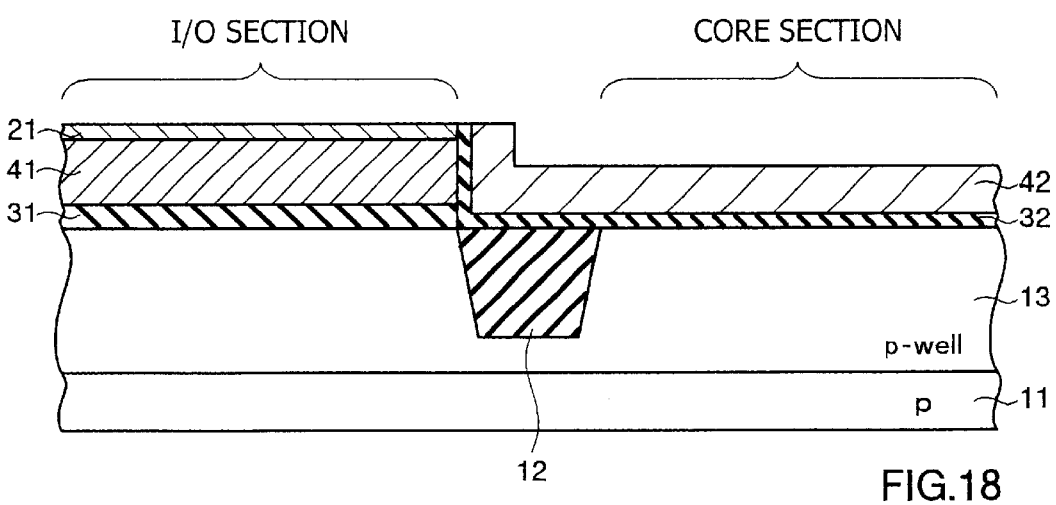

After the formation of the refractory metal film 42, the chemical-mechanical polishing (CMP) is carried out while using the silicon nitride film 21 as a stopper, to remove the refractory metal film 42 at the I/O section as shown in FIG. 18.

Figure 19:
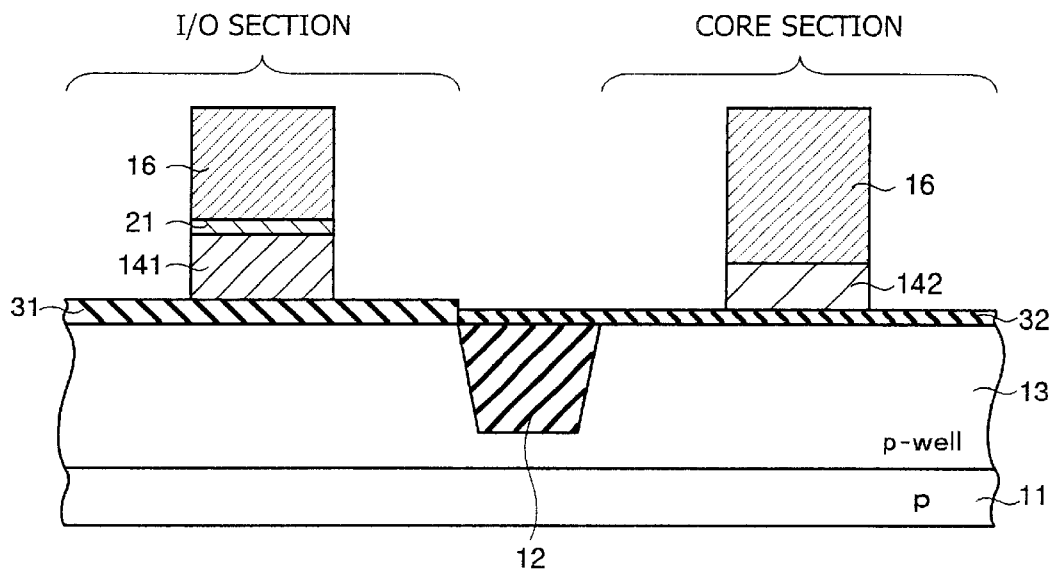

Then, a photoresist film 16 is formed at desired positions corresponding to gate electrodes to be formed, on the exposed surface. Then, the silicon nitride film 21, polysilicon film 41, and the refractory metal film 42 are etched, so that the silicon nitride film 21, polysilicon film 41, and the refractory metal film 42 just beneath the photoresist film 16 remain as shown in FIG. 19. Thus, a gate electrode 141 (remaining polysilicon film 41) whose gate length is 0.35 micrometers for the I/O section, and a gate electrode 142 (remaining refractory metal film 42) whose gate length is 0.1 micrometer for the core section are formed.

Then, the photoresist film 16 and the silicon nitride film 21 on the gate electrode 141 are removed. The following steps are carried out in the same manner as the first embodiment. A photoresist film 17 is formed at the core section (see FIG. 8). Then, phosphorus is implanted into the I/O section by the ion implantation with masking by the photoresist film 17 and the gate electrode 141 at the I/O section, and LDD regions 51 for the I/O section are formed by the thermal diffusion.

After removing the photoresist film 17, another photoresist film 18 is formed at the section (see FIG. 9). Arsenic is implanted into the I/O section by the ion implantation with masking by the photoresist film 18 and the gate electrode 142, then extended source/drain regions 52 for the core section are formed by the thermal diffusion.

After removing the photoresist film 18, a silicon oxide film 19 is formed all over the exposed surface. The silicon oxide film 19, the oxide films 31 and 32 are etched back, so that side walls 19 (silicon oxide film) of the gate electrodes 141 and 142, the oxide film 31 just beneath the gate electrode 141 and its side walls 19, and the oxide film 32 just beneath the gate electrode 142 and its side walls 19 remain (see FIG. 10). Thus, the side walls 19, a gate insulation film 131 (remaining oxide film 31) for the I/O section, and a gate insulation film 132 (remaining oxide film 32) for the core section are formed.

Figure 20:
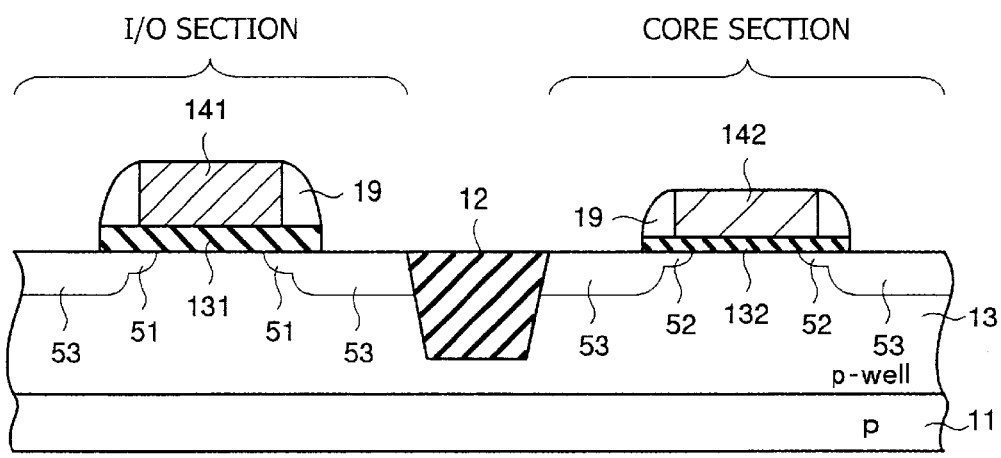

Then, arsenic is implanted into the exposed surface by the ion implantation with masking by the gate electrodes 141, 142 and side walls 19, to form source/drain regions 53 for the I/O section and source/drain regions 54 for the core section are formed as shown in FIG. 20.

According to the method describe above, the pre-formation treatment is carried out while the polysilicon film 41 to be a gate electrode has been formed on the oxide film 31 at the I/O section. Therefore, the oxide film 31 is not damaged by the pre-formation treatment. Further, the polysilicon film 41 acts as a protection film while forming the oxide film 32 for the core section by the thermal oxidation. Therefore, no additional oxide film is formed on the oxide film 31.

Those features are helpful to form desired gate insulation film 131. As a result, highly reliable semiconductor device is available by the method of the present invention.

In the above first and second embodiments, the oxide films 31 and 32 are formed to be the gate insulating films 131 and 132 by the thermal oxidation. Other insulation films such as an oxide-nitride film may be used instead of the oxide films 31 and 32 for forming the gate insulation films 131 and 132. Instead of polysilicon, the other conductive material such as polycide may be employed to form the gate electrode 141 at the I/O section. Instead of the refractory metal, refractory silicide may be employed as another conductive material for the gate electrode 142 at the core section.

In the above embodiments, the barrier metal layer is formed before the refractory metal film 42 is formed at the core section. The refractory metal film 42 may be formed on he oxide film 32 directly.

Instead of removing the oxide film 32 on the polysilicon film 41 (gate electrode 141), the silicon nitride film 21, and the refractory metal layer 42, those may be remained to employ the silicide structure.

Values described in the above are just exemplified, therefore, those are not limited to the described ones.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-235003 filed on Aug. 23, 1999 and including specification, claims, drawings and summary. The disclosure of the above Japanese Patent Application is incorporated herein by reference in its entirety.

What is claimed is:

1. A method of manufacturing a semiconductor device comprising:

forming a section separator region in a semiconductor substrate to separate said semiconductor substrate into a first region and a second region;

forming a first insulation film at said first region on said semiconductor substrate forming a first gate electrode material layer on said first insulation film;

forming a second insulation film whose thickness differs from the thickness of said first insulation film over the exposed surface after said first gate electrode material layer is formed;

forming a second gate electrode material layer on said second gate insulation film removing said second gate electrode material layer at said first region after said second gate electrode material layer is formed;

forming a first gate electrode with said first gate electrode material layer at said first region after said second gate electrode material layer is removed, while forming a second gate electrode with said second gate electrode material layer at said second region;

removing second insulation film remaining on said first gate electrode after said first and second gate electrodes are formed;

forming first source/drain regions at said first region, and forming second source/drain regions at said second region, after said second insulation film is removed; and etching said first and second insulation films with masking by said first and second gate electrodes to form a first and second gate insulation films, after said first and second source/drain regions are formed.

2. A method of manufacturing a semiconductor device, the method, comprising:

forming a section separator region in a semiconductor substrate to separate said semiconductor substrate into a first region and a second region;

forming a first insulation film at said first region on said semiconductor substrate;

forming a first gate electrode material layer on said first insulation film;

forming a protection film only on said first gate electrode material layer;

forming a second insulation film at said second region after said protection film is formed;

forming a second gate electrode material layer over an exposed surface including surfaces of said protection film and said second insulation film, after said second insulation film is formed;

removing said second gate electrode material layer at said first region after said second gate electrode material layer is formed;

forming a first gate electrode with said first gate electrode material layer at said first region after said second gate electrode material layer is removed, while forming a second gate electrode with said second gate electrode material layer at said second region;

forming first source/drain regions at said first region, and forming second source/drain regions at said second region; and etching said first and second insulation films with masking by said first and second gate electrodes to form a first and a second gate insulation film, after said first and second source/drain regions are formed.

3. The method according to claim 2, wherein said removing includes polishing said second gate electrode material layer on said protection film which acts as a stopper.

4. The method according to claim 3, wherein said protection film comprises silicon nitride.

5. The method according to claim 2, wherein said first gate electrode material layer comprises at least one of polysilcion and polycide.

6. The method according to claim 2, wherein said second gate electrode material layer includes at least one of a refractory metal and a refractory silicide.

7. The method according to claim 6, further comprising forming a barrier metal between said second gate electrode material layer of said at least one of said refractory metal and said refractory silicide and said second gate electrode insulation film.

8. The method according to claim 2, wherein
each of said first and second source/drain regions has a predetermined concentration,
a plurality of side walls corresponding to said first and second gate electrodes are formed after said source/drain regions are formed,
third and fourth source/drain regions whose concentrations differ from said predetermined concentrations of each of said first and second source/drain regions are formed so as to connect to said first and second source/drain regions, respectively, after said side walls are formed, and
forming said first and second gate insulation films includes etching said first and second insulation films with masking by said first and second gate electrodes and said side walls.

9. A method of manufacturing a semiconductor device, the method, comprising:
forming a section separator region in a semiconductor substrate to separate said semiconductor substrate into a first region and a second region;
forming a first insulation film at said first region on said semiconductor substrate;
forming a first gate electrode material layer on said first insulation film;
forming a second insulation film whose thickness differs from a thickness of said first insulation film over an exposed surface after said first gate electrode material layer is formed;
forming a second gate electrode material layer on said second gate insulation film;
removing said second gate electrode material layer at said first region after said second gate electrode material layer is formed;
forming a first gate electrode with said first gate electrode material layer at said first region after said second gate electrode material layer is removed, while forming a second gate electrode with said second gate electrode material layer at said second region;
removing said second insulation film remaining on said first gate electrode after said first and second gate electrodes are formed;
forming first source/drain regions at said first region and second source/drain regions at said second region; and
etching said first and second insulation films with masking by said first and second gate electrodes to form first and second gate insulation films after said first and second source/drain regions are formed, wherein
each of said first and second source/drain regions has a predetermined concentration,
a plurality of side walls corresponding to said first and second gate electrodes are formed after said first and second source/drain regions are formed,
third and fourth source/drain regions whose concentrations differ from said predetermined concentration of each of said first and second source/drain regions, respectively, are formed so as to connect to said first and second source/drain regions, respectively, after said plurality of side walls is formed, and
forming said first and second gate insulation films includes etching said first and second insulation films with masking by said first and second gate electrodes and said plurality of side walls.

10. The method according to claim 9, wherein, said plurality of side walls comprise silicon oxide.

11. A method of manufacturing a semiconductor device, the method, comprising:
forming a section separator region in a semiconductor substrate to separate said semiconductor substrate into a first region and a second region;
forming a first insulation film at said first region on said semiconductor substrate;
forming a first gate electrode material layer on said first insulation film;
forming a second insulation film whose thickness differs from a thickness of said first insulation film over an exposed surface after said first gate electrode material layer is formed;
forming a barrier metal on said second insulation film;
forming a second gate electrode material layer on said barrier metal, wherein said second gate electrode material layer comprises at least one of a refractory metal and a refractory silicide and said barrier metal is disposed between said second gate electrode insulation film and said second gate electrode material layer;
removing said second gate electrode material layer at said first region after said second gate electrode material layer is formed;
forming a first gate electrode with said first gate electrode material layer at said first region after said second gate electrode material layer is removed, while forming a second gate electrode with said second gate electrode material layer at said second region;
removing said second insulation film remaining on said first gate electrode after said first and second gate electrodes are formed;
forming first source/drain regions at said first region and second source/drain regions at said second region; and
etching said first and second insulation films with masking by said first and second gate electrodes to form first and second gate insulation films after said first and second source/drain regions are formed.

12. A method of manufacturing a semiconductor device, the method, comprising:
forming a section separator region in a semiconductor substrate to separate said semiconductor substrate into a first region and a second region;
forming a first insulation film at said first region on said semiconductor substrate;
forming a first gate electrode material layer on said first insulation film;
forming a second insulation film whose thickness differs from a thickness of said first insulation film over an exposed surface at said second region after said first gate electrode material layer is formed and directly on said first gate electrode material layer at said first region;
forming a second gate electrode material layer on said second gate insulation film;

removing said second gate electrode material layer at said first region after said second gate electrode material layer is formed;

forming a first gate electrode with said first gate electrode material layer at said first region after said second gate electrode material layer is removed, while forming a second gate electrode with said second gate electrode material layer at said second region;

removing said second insulation film remaining on said first gate electrode after said first and second gate electrodes are formed;

forming first source/drain regions at said first region and second source/drain regions at said second region; and etching said first and second insulation films with masking by said first and second gate electrodes to form first and second gate insulation films after said first and second source/drain regions are formed.

13. The method according to claim 12, wherein each of said first and second source/drain regions has a predetermined concentration, a plurality of side walls corresponding to said first and second gate electrodes are formed after said source/drain regions are formed, third and fourth source/drain regions whose concentrations differ from said predetermined concentrations of each of said first and second source/drain regions are formed so as to connect to said first and second source/drain regions, respectively, after said side walls are formed, and forming said first and second gate insulation films includes etching said first and second insulation films with masking by said first and second gate electrodes and said side walls.

14. The method according to claim 12, wherein said first gate electrode material layer comprises at least one of polysilcion and polycide.

15. The method according to claim 12, wherein said second gate electrode material layer includes at least one of a refractory metal and a refractory silicide.

16. The method according to claim 15, further comprising forming a barrier metal between said second gate electrode material layer of said at least one of said refractory metal and said refractory silicide and said second gate electrode insulation film.

17. The method according to claim 12, wherein said first insulation film is formed by oxidation.

18. The method according to claim 12, wherein said second insulation film is formed by oxidation.

* * * * *